United States Patent
Chen et al.

(10) Patent No.: US 8,808,063 B2
(45) Date of Patent: Aug. 19, 2014

(54) METHOD FOR REMOVING POLISHING BYPRODUCTS AND POLISHING DEVICE

(75) Inventors: Feng Chen, Shanghai (CN); Mingqi Li, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 412 days.

(21) Appl. No.: 13/308,526

(22) Filed: Nov. 30, 2011

(65) Prior Publication Data

US 2012/0309278 A1     Dec. 6, 2012

(30) Foreign Application Priority Data

May 31, 2011    (CN) ......................... 2011 1 0145429

(51) Int. Cl.
     *B24B 21/18*      (2006.01)
(52) U.S. Cl.
     USPC .............................................. 451/444; 134/1
(58) Field of Classification Search
     CPC ........ B24B 53/001; B24B 53/017; B08B 6/00
     USPC .............................................. 451/444; 134/1
     See application file for complete search history.

(56) References Cited

U.S. PATENT DOCUMENTS

| | | | |
|---|---|---|---|
| 2001/0031558 A1 | 10/2001 | Sun et al. | |
| 2007/0095677 A1 * | 5/2007 | Wang et al. | 205/660 |
| 2008/0182490 A1 * | 7/2008 | Fang et al. | 451/443 |
| 2008/0287041 A1 * | 11/2008 | Kordic et al. | 451/72 |

* cited by examiner

*Primary Examiner* — Nicholas A Smith
(74) *Attorney, Agent, or Firm* — Anova Law Group, PLLC

(57) ABSTRACT

A method for removing polishing byproducts and a polishing device are provided. The method includes mounting a positive electrode on the center of a polishing platen and a negative electrode on an edge of the polishing platen, applying a voltage between the positive electrode and the negative electrode after a polishing process for metal is finished, and rotating the polishing platen and rinsing a polishing pad with deionized water or a chemical cleaning solution to remove polishing byproducts that are formed in the polishing process. The combination of the centrifugal force and the electromotive force increases the removal rate of the polishing byproducts.

12 Claims, 3 Drawing Sheets

METHOD FOR REMOVING POLISHING BYPRODUCTS AND POLISHING DEVICE

CROSS-REFERENCES TO RELATED APPLICATIONS

The present application claims the priority to Chinese Patent Application No. 201110145429.6, entitled "Method for Removing Polishing Byproducts and Polishing Device", and filed on May 31, 2011, the entire disclosure of which is incorporated herein by reference.

FIELD OF THE INVENTION

The present invention generally relates to the field of semiconductor manufacturing, and more particularly, to a method and an apparatus for removing polishing byproducts in polishing tools.

BACKGROUND OF THE INVENTION

Along with the advance in technological development of the semiconductor industry, semiconductor manufacturing technology has entered into the nano-era, which means millions of transistors and interconnecting wires need to be formed on a chip within a few square centimeters when manufacturing a very large scale integrated (VLSI) circuit chip. Accordingly, techniques for forming multi-metal layer structures have been developed to internally interconnect transistors and support elements. Chemical mechanical polishing (CMP) is a technique widely used for planarization the surface of semiconductor wafers, which is important for forming the multi-metal layer structures.

In 1984, IBM introduced CMP into the field of semiconductor manufacturing. CMP was firstly applied to planarization of inter-metal dielectric (IMD) layers in backend processes. With the improvement of devices and semiconductor processes, CMP has been applied to planarize tungsten, shallow trench isolation (STI) and copper. CMP has become a fast-growing and valuable process for IC fabrication in recent years.

The basic principle of CMP is to apply a mechanical force from abrasives in the polishing slurry towards a surface of a material to be polished, thereby generating a motive power leading to corrosion cracking in a thin layer surface with which chemical substance in the polishing slurry reacts to improve removal rate. Specifically, when a metal material is polished, the chemical substance reacts with the metal material, so that metal oxide is formed. Then the metal oxide is removed in an action of the mechanical force, so that a flat surface is obtained.

However, a large quantity of polishing byproducts including metal ions (e.g. $Cu^+$ or $Cu^{2+}$) are produced in the polishing process. This issue is particularly serious during the polishing process with a high removal rate, that is, for example, polishing copper for a top metal layer or a TSV structure of 3D packaging. The high removal rate of the metal material can cause large concentration of the polishing byproducts which may reduce the removal rate, impact the stability of the removal rate and increase defects on the metal material. Therefore, there is a need for reducing or removing the byproducts in the polishing process for metal.

FIG. 1 is a schematic top view illustrating a conventional technique for removing polishing byproducts. As shown in FIG. 1, a wafer 101 is polished on a polishing pad 103 that is disposed on a rotating polishing platen 100 (shown in FIG. 2). As described above, when the metal material on a surface of the wafer 101 is being polished with a polishing slurry, a large quantity of polishing byproducts 102 (only one of the byproducts is labeled in FIG. 1) that include metal ions are formed. During the polishing process, the polishing platen keeps rotating, so some of the polishing byproducts 102 are removed with the polishing slurry by the centrifugal force of the polishing pad. In subsequent steps (in which the wafer 101 is removed from the polishing pad 103), the polishing platen is still rotating when the polishing pad 103 arranged thereon is rinsed with deionized water or chemical cleaning solution, so some of the polishing byproducts 102 are removed with the deionized water or chemical cleaning solution in the action of the centrifugal forces.

FIG. 2 is a schematic front view illustrating a conventional technique for removing the polishing byproducts. As shown in FIG. 2, the wafer 101 is secured on a polishing head 104 by means of vacuum and pressed on the polishing pad 103 that is disposed on the polishing platen 100. The polishing platen is rotated by a rotatable axis 105 and the polishing head 104 is also rotatable relative to the polishing platen to provide a polishing motion. The polishing byproducts 102 are removed together with the polishing slurry, the deionized water or the chemical cleaning solution in the action of the centrifugal forces. However, the removal rate of the polishing byproducts is unacceptable in the prior art, especially in a polishing process which includes a relatively long polishing time period or a metal layer that has relatively large thickness.

US Patent Publication No. 20010031558A1 discloses methods for removing polishing byproducts in a CMP process for aluminum so as to reduce scratches which are formed on the wafer. However, this disclosure only partially solves the above described problems.

Therefore, there is a need to have a method and apparatus for removing the polishing byproducts with an acceptable removal rate.

BRIEF SUMMARY OF THE INVENTION

Embodiments of the present invention provide a method for removing polishing byproducts. In an embodiment, the method includes providing a positive electrode on the center of a polishing platen and a negative electrode on an edge of the polishing platen, applying a voltage between the positive electrode and the negative electrode after a polishing process for metal is finished, and rotating the polishing platen and rinsing a polishing pad with deionized water or a chemical cleaning solution so as to remove polishing byproducts that are formed in the polishing process.

Optionally, the negative electrode is annular.

Optionally, a conditioning process is included after the polishing pad is rinsed with the deionized water or the chemical cleaning solution.

Optionally, the conditioning process is performed with a diamond pad conditioner.

Optionally, the polishing platen is rotated at a rotational speed ranging from about 10 rpm to about 120 rpm.

Optionally, the voltage applied between the positive electrode and the negative electrode ranges from about 0 V to about 10 V.

Optionally, the positive electrode and the negative electrode include metal or surfaces electroplated with metal.

In accordance with embodiments of the present invention, a polishing device includes a polishing platen, a DC power supply having a first terminal and a second terminal, a positive electrode disposed on the center of the polishing platen and a negative electrode disposed on an edge of the polishing platen, the positive electrode is coupled to the first terminal of the power supply and the negative electrode is coupled to a second terminal of the power supply, wherein the first terminal has a potential higher than the second terminal.

Optionally, the negative electrode is annular.

Optionally, the positive electrode and the negative electrode include metal or surfaces being electroplated with metal.

Compared with prior art, embodiments provided by the present invention can effectively remove the byproducts formed when polishing a metal material. The voltage is applied between the electrodes that are electrically isolated and disposed on the center and the edge of the polishing platen, so that an electric field is formed thereon, which generates an electromotive force. Rotating the polishing platen and rinsing the polishing pad with the deionized water or the chemical cleaning solution can remove the byproducts in the action of the centrifugal forces. Therefore, the byproducts are removed in a combined action of the electromotive force and the centrifugal force, which may provide a higher removal rate of the byproducts.

DETAILED DESCRIPTION OF THE INVENTION

The conventional techniques which apply centrifugal forces to remove polishing byproducts formed in a polishing process for metal have low removal rates. Embodiments provided by the present invention can effectively remove the polishing byproducts having an increase in removal rates. A voltage is applied between electrodes provided on a center and an edge of a polishing platen, so that an electric field is formed thereon, which generates electromotive force that improves the removal rate of the polishing byproducts. In addition, by rotating the polishing platen and rinsing the polishing pad with deionized water or a chemical cleaning solution, the byproducts are removed by a centrifugal force. Therefore, the byproducts are removed in a combined action of the electromotive force and the centrifugal force, which may provide a higher removal rate of the byproducts.

In order to clarify the objects, characteristics and advantages of the invention, embodiments of the invention are interpreted in detail in conjunction with the accompanying drawings.

Although the present invention is disclosed hereinafter with reference to preferred embodiments, it also can be implemented in other different embodiments and those skilled in the art may modify and vary the embodiments without departing from the spirit and scope of the present invention. Therefore, the present invention should not be limited by the embodiments disclosed herein.

Figure 1:
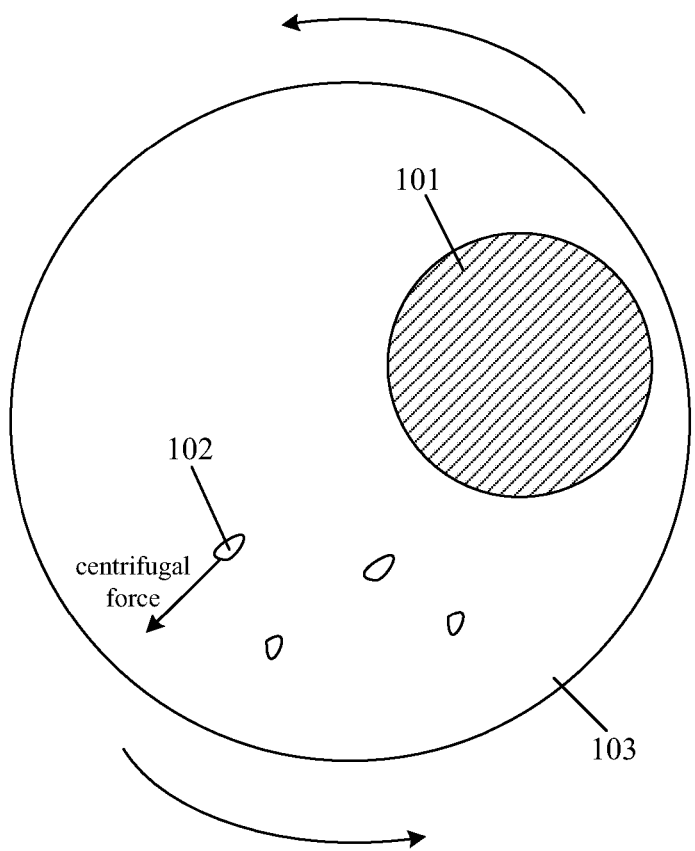
FIG. 1 is a schematic top view for illustrating a conventional technique for removing polishing byproducts.
Figure 2:
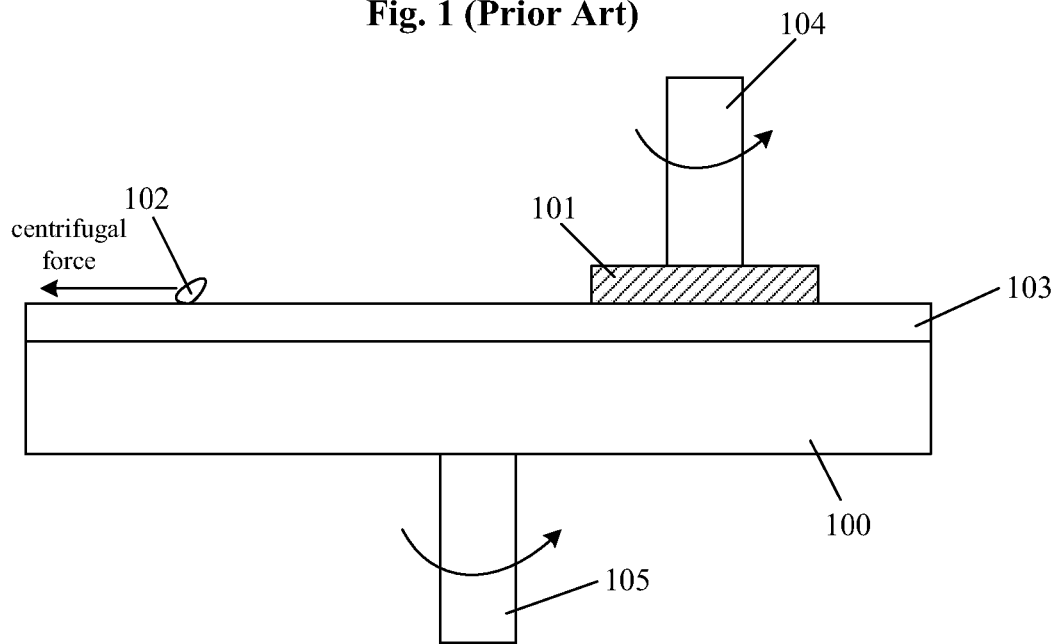
FIG. 2 is a schematic front view for illustrating a conventional technique for removing polishing byproducts.
Figure 3:
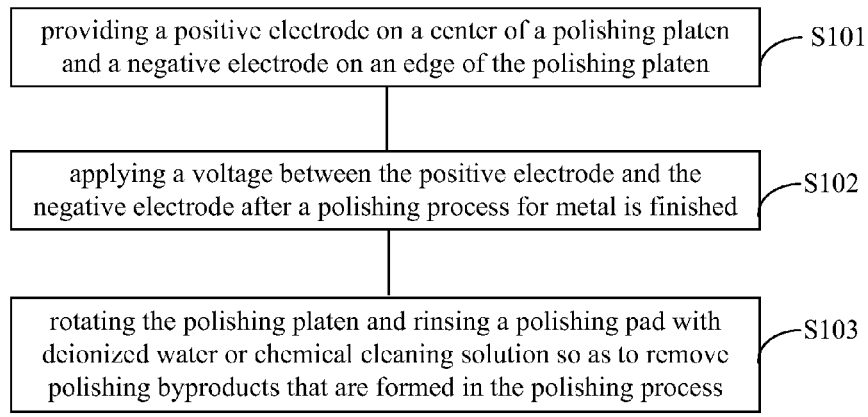
FIG. 3 is a flow chart of a method for removing polishing byproducts according to an embodiment of the present invention.

FIG. 3 is a flow chart of a method for removing polishing byproducts according to an embodiment of the present invention. As shown in FIG. 3, the method includes:

step S101: configuring a positive electrode on a center of a polishing platen and a negative electrode on an edge of the polishing platen;

step S102: applying a voltage between the positive electrode and the negative electrode after a polishing process for metal is finished; and step S103: rotating the polishing platen and rinsing a polishing pad with deionized water or a chemical cleaning solution to remove polishing byproducts that are formed in the polishing process.

The method aforesaid is described hereinafter with reference to preferred embodiments.

Figure 4:
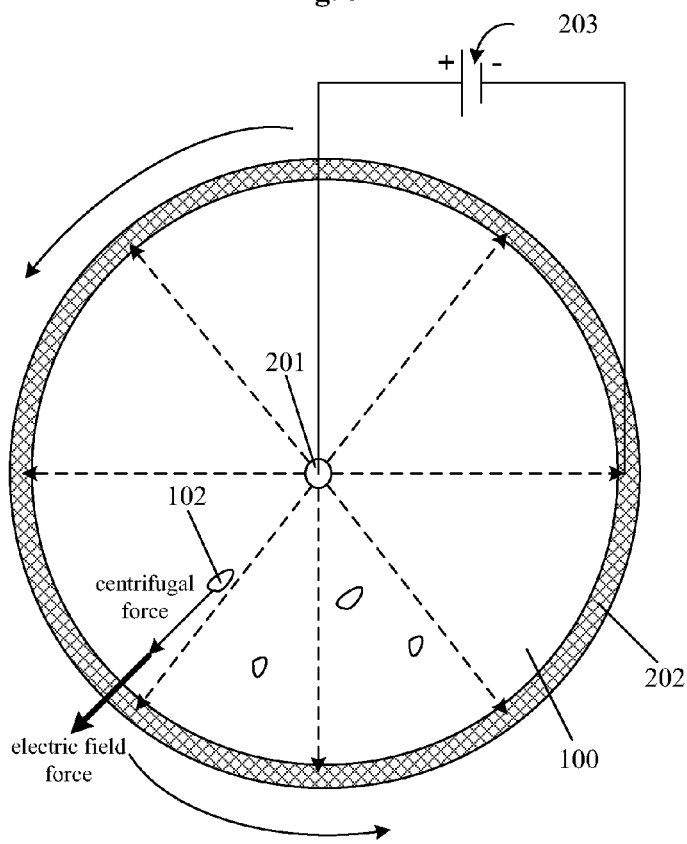
FIG. 4 is a schematic top view for illustrating a method for removing polishing byproducts according to an embodiment of the present invention.
Figure 5:
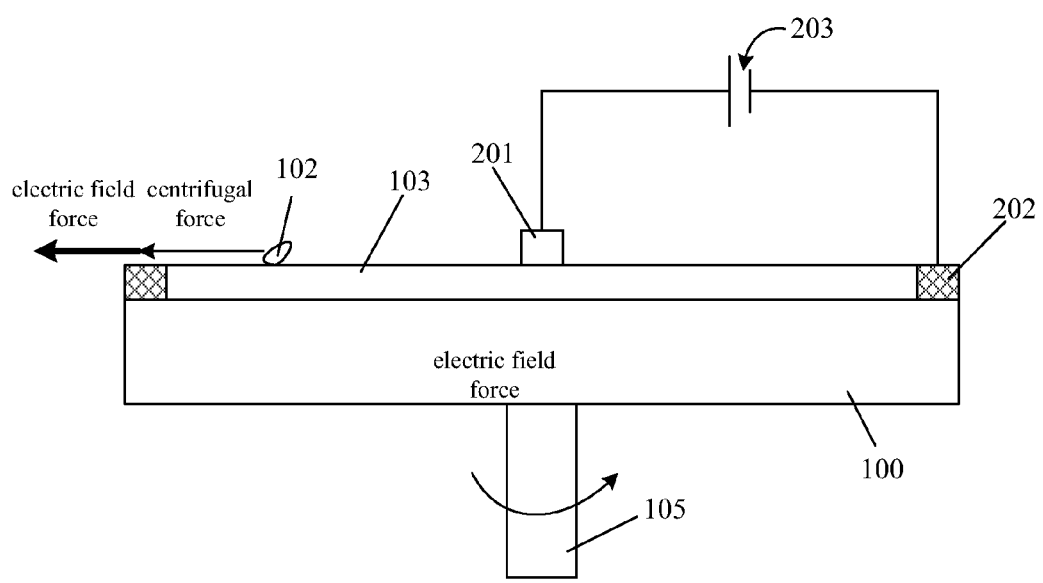
FIG. 5 is a schematic front view for illustrating a method for removing polishing byproducts according to an embodiment of the present invention.

FIGS. 4 and 5 are a schematic top view and a schematic front view, respectively, for illustrating a method and an apparatus for removing polishing byproducts according to an embodiment of the present invention. Referring to FIGS. 3 to 5, step S101 is performed. A positive electrode 201 is mounted on the centre of a polishing platen 100. A negative electrode 202 is mounted on an edge of the polishing platen 100. The positive electrode 201 is coupled to a first terminal of a power supply 203 and the negative electrode 202 is coupled to a second terminal of the power supply 203. In an exemplary embodiment, the positive electrode 201 and the negative electrode 202 may include a metal material, such as stainless steel, copper, and the like. In another embodiment, the electrodes 201, 202 have surfaces that are electroplated with metal materials. When a surface of a wafer containing a conductive material (e.g., copper) is being polished, the power supply 203 is turned off or the positive electrode 201 and the negative 202 are disconnected from the power supply 203. The polishing platen 100 is rotated by a rotatable axis 105, which generates centrifugal forces. Byproducts 102 are formed and some of which are removed together with a polishing slurry by the centrifugal force. The following description will employ polishing copper for a top metal layer or a TSV structure of 3D packaging as an example.

In an exemplary embodiment, as shown in FIG. 4, the negative electrode 202 is annular. In an alternative embodiment, the negative electrode 202 can includes a plurality of electrodes having other shapes. Each of the negative electrodes is coupled to the second terminal (that has a potential or voltage lower than the first terminal) of the power supply 203.

Thereafter, step S102 is performed. After the polishing process is finished, a voltage is applied between the positive electrode 201 and the negative electrode 202. Specifically, after the polishing process for the metal material on the surface of the wafer is finished, the wafer is taken away from the polishing pad 103. The power supply 203 is turned on (the positive electrode 201 and the negative 202 are coupled to the positive terminal and the negative terminal of the power supply 203, respectively), which forms an electric field between the positive electrode 201 and the negative electrode 202. Directions of the electric field are indicated by dotted arrows shown in FIG. 4. In a specific embodiment, the voltage ranges from about 0 V to about 10 V.

Thereafter, step S103 is performed. The polishing platen is rotated and the polishing pad 103 is rinsed with deionized water or a chemical cleaning solution, so that polishing products 102 produced in the polishing process are removed. Specifically, the polishing platen 100 is in a rotational state so some of the polishing byproducts 102 are removed with the deionized water or the chemical cleaning solution in an action of centrifugal forces. In a specific embodiment, the polishing platen is rotated at a rotational speed ranging from about 10 rpm to about 120 rpm. At the same time, the electric field that has directions from the center to the edge of the polishing platen 100 generates electric field forces which are applied to the byproducts 102. The byproducts 102 include metal ions which are positive, so directions of the electric field forces are from the center to the edge of the polishing platen 100. In conclusion, the byproducts 102 are removed with the deionized water or the chemical cleaning solution in a combined action of the centrifugal forces and the electric field forces, which may increase the removal rate.

In an exemplary embodiment, after step S103 is performed, a conditioning process is performed to the polishing pad 103. A large amount of the polishing byproducts 102 may be disposed in grooves of the polishing pad 103. The polishing byproducts 102 in the grooves can not be completely removed merely by rinsing the polishing pad 103 with the deionized water or the chemical cleaning solution. Therefore, there is a need to pull the polishing byproducts 102 out of the grooves by using a pad conditioner. During the conditioning process, the polishing pad is rinsed with the deionized water or the chemical cleaning solution, so that the polishing byproducts 102 can be removed. In a specific embodiment, the conditioning process is performed with a diamond pad conditioner. In a preferable embodiment, during the conditioning process, the polishing platen 100 is rotated and the power supply 203 is turned on, so that the polishing byproducts 102 can be removed in the combined action of the electric field forces and the centrifugal forces, which may obtain a higher removal rate.

The following provides an example for calculating the centrifugal force and the electromotive force. In an example embodiment, the polishing byproducts include metal ions $Cu^{2+}$. Each of the metal ions $Cu^{2+}$ includes an electric charge equals to 2e (e is the elementary electric charge carried by a single proton, which equals to $1.6\times10^{-19}$ C) and has a mass which is denoted as M. The polishing platen has a radius which is denoted as r. The voltage between the positive electrode and the negative electrode is denoted as U. The polishing platen is rotated at a rotational speed which is denoted as w. In an exemplary embodiment, r equals to 0.5 m, U equals to 10 V, M equals to $64\times1.67\times10^{-27}$ kg and w equals to 5.2 rd/s.

Using the data above, the electric field force=$2eU/r=6.4\times10^{-18}$N and the centrifugal force=$M\omega^2 r=1.5\times10^{-24}$N.

In light of the above, the electric field force applied to the metal ion is much greater than the centrifugal force applied to the metal ion. Therefore, compared with the prior art, a larger removal rate may be obtained.

In alternative embodiments, other metal materials may be included in the surface of the wafer, for example, Al or aluminum alloy which is usually applied in a process for forming a metal gate. In a CMP process for Al, a large amount of polishing byproducts (which are mainly aluminum oxide and aluminum hydroxide) are disposed in the grooves of the polishing pad. Al has a very low rigidity and the polishing byproducts have a much higher rigidity. Therefore, in a subsequent CMP process for another wafer, scratches may be formed on a surface of the Al which is included in the wafer, which may affect the performance and stability of semiconductor devices. The polishing byproducts are insoluble in the deionized water, so the polishing byproducts can not be completely removed merely by rinsing the polishing pad with the deionized water and rotating the polishing platen. Therefore, the chemical cleaning solution such as an organic acid solution is applied to rinse the polishing pad. However, the removal rate is still unacceptable. Therefore, there is a need to provide a method for removing the polishing byproducts in the CMP process for Al. The steps of the method are identical to the embodiments described above, so further description is omitted.

It should be noted that, in alternative embodiments, step S101 may be performed after the polishing process for metal is completed. Specifically, after the polishing process for the metal on the surface of the wafer is completed, the positive electrode is placed on the center of the polishing platen and the negative electrode is placed on the edge of the polishing platen. Thereafter, the voltage is applied between the positive electrode and the negative electrode. Thereafter, step S103 is performed.

Embodiments of the present invention provide a method for removing polishing byproducts after planarizing a layer of a substrate that contains a conductive material (e.g., copper). The method includes removing the substrate from a polishing platen, placing a first electrode on the center of the polishing platen and a second electrode on an outer edge of the polishing platen, and applying an electric field between the first and second electrodes to generate an electromotive force, and removing the polishing byproducts using the electromotive force while rotating the polishing platen. In an embodiment, the electric field is a result of an applied voltage or an electric potential from about 0V to 10V between the electrodes.

Embodiments of the present invention also provide a polishing device that has the above described features and characteristics. In an embodiment, referring to FIGS. 4 and 5, the polishing device includes a power supply 203, a positive electrode 201 disposed on the center of a polishing platen 100 and a negative electrode 202 disposed on an edge of the polishing platen 100. The positive electrode 201 is coupled to a positive terminal of the power supply 203 and the negative electrode 202 is coupled to a negative terminal of the power supply 203. In a specific embodiment, the negative electrode 202 is annular and covers the periphery of the polishing platen. The positive electrode 201 and the negative electrode 202 include metal or surfaces electroplated with metal.

The operation of the polishing device is described in embodiments of the method for removing polishing byproducts described above, so further detail description is omitted.

In conclusion, embodiments of the present invention can effectively remove byproducts that are formed when polishing a metal material. The voltage is applied between a positive electrode and a negative electrode. The electrodes are electrically isolated from each other. The positive electrode is mounted on the center and the negative electrode is mounted on an edge of the polishing platen, so that an electric field is formed thereon, which generates an electromotive force. In other words, the negative electricity (negative charge) on the surface of the negative electrode will attract electrostatically the positive ions in the polishing byproducts. In addition, by rotating the polishing platen and rinsing the polishing pad with deionized water or a chemical cleaning solution, the byproducts are removed in the action of the centrifugal forces. Therefore, the byproducts are removed in a combined action of the electromotive force and the centrifugal force, which may provide a higher removal rate of the byproducts.

The invention is disclosed, but not limited, by preferred embodiments as above. Based on the disclosure of the invention, those skilled in the art can make any variation and modification without departing from the scope of the invention. Therefore, any simple modification, variation and polishing based on the embodiments described herein is within the scope of the present invention.

What is claimed is:

1. A method for removing polishing byproducts, the method comprising:

providing a positive electrode on a center of a polishing platen and a negative electrode on an edge of the polishing platen;

applying a voltage between the positive electrode and the negative electrode after a polishing process for metal is finished; and rotating the polishing platen and rinsing a polishing pad with deionized water or chemical cleaning solution so as to remove polishing byproducts that are formed in the polishing process.

2. The method according to claim 1, wherein the negative electrode is annular.

3. The method according to claim 1, further comprising performing a conditioning process to the polishing pad after the polishing pad is rinsed with the deionized water or the chemical cleaning solution.

4. The method according to claim 3, wherein the conditioning process is performed with a diamond pad conditioner.

5. The method according to claim 1, wherein the polishing platen is rotated at a rotational speed ranging from about 10 rpm to about 120 rpm.

6. The method according to claim 1, wherein the voltage applied between the positive electrode and the negative electrode ranges from about 0 V to about 10 V.

7. The method according to claim 1, wherein the positive electrode and the negative electrode comprise metal or surfaces being electroplated with metal.

8. A method for removing polishing byproducts after planarizing a layer of a substrate containing a conductive material, the method comprising:

removing the substrate from a polishing platen;

placing a first electrode on the center of the polishing platen and a second electrode on an edge of the polishing platen; and applying an electric field between the first and second electrodes to remove the polishing byproducts using an electromotive force generated by the electric field.

9. The method according to claim 8, wherein the electric field is a result ao an applied potential from about 1V to 10V between the first and second electrodes.

10. The method according to claim 8, wherein the electromotive force is of about $6.4 \times 10^{-18}$ N.

11. The method according to claim 8, wherein the first and second electrodes comprise metal or surfaces being electroplated with metal.

12. The method according to claim 8, wherein the polishing byproducts comprise metal ions $Cu^{2+}$.

* * * * *